United States Patent
Wang et al.

(10) Patent No.: US 12,239,017 B2
(45) Date of Patent: Feb. 25, 2025

(54) ORGANIC LIGHT-EMITTING DEVICES, DISPLAY PANELS AND DISPLAY APPARATUSES

(71) Applicant: BOE Technology Group Co., Ltd., Beijing (CN)

(72) Inventors: Siqi Wang, Beijing (CN); Haiyan Sun, Beijing (CN); Xiaojin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 849 days.

(21) Appl. No.: 17/462,859

(22) Filed: Aug. 31, 2021

(65) Prior Publication Data

US 2022/0102648 A1 Mar. 31, 2022

(30) Foreign Application Priority Data

Sep. 28, 2020 (CN) .......................... 202011045754.0

(51) Int. Cl.
*H01L 51/00* (2006.01)
*C09K 11/06* (2006.01)
(Continued)

(52) U.S. Cl.
CPC ............ *H10K 85/654* (2023.02); *C09K 11/06* (2013.01); *H10K 85/631* (2023.02);
(Continued)

(58) Field of Classification Search
CPC ............. H01L 51/0067; H01L 51/5004; H01L 51/0072; H01L 51/0059
See application file for complete search history.

(56) References Cited

U.S. PATENT DOCUMENTS

2019/0058146 A1* 2/2019 Li ........................ H10K 50/11
2022/0165975 A1* 5/2022 Mei ...................... H10K 50/16

FOREIGN PATENT DOCUMENTS

WO WO-2015085729 A1 * 6/2015 ........... C07D 401/14
WO WO-2018018999 A1 * 2/2018 ......... H01L 27/3206

OTHER PUBLICATIONS

WO 2015/085729 A1 (Year: 2015).*
WO 2018/018999 A1 (Year: 2018).*

* cited by examiner

*Primary Examiner* — Robert D Harlan
(74) *Attorney, Agent, or Firm* — IPro, PLLC

(57) ABSTRACT

Organic light-emitting devices, display panels and display apparatuses are provided. An organic light-emitting device includes: a first electrode layer; a first light-emitting layer provided on the first electrode layer and including a first host material and a first guest material; a second light-emitting layer provided on the first light-emitting layer and including a second host material and a second guest material; and a second electrode layer provided on the second light-emitting layer. The first guest material has a general structural formula as indicated in Formula I. X is selected from carbon, nitrogen, oxygen, sulfur, or boron; Y is selected from nitrogen or boron, and Y is different from X; and $R_1$ and $R_2$ are selected from hydrogen, methyl, isopropyl, tert-butyl, substituted or unsubstituted aryl, substituted or unsubstituted alkyl aryl, or substituted or unsubstituted nitrogen-containing aryl, respectively.

(Continued)

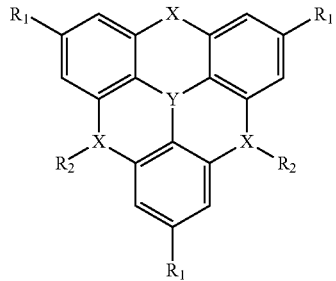
Formula I
19 Claims, 3 Drawing Sheets
(51) Int. Cl.
  *H10K 85/60* (2023.01)
  *H10K 50/11* (2023.01)
  *H10K 101/00* (2023.01)
  *H10K 101/20* (2023.01)
  *H10K 101/40* (2023.01)
(52) U.S. Cl.
  CPC .. *H10K 85/6572* (2023.02); *C09K 2211/1022* (2013.01); *H10K 50/11* (2023.02); *H10K 2101/20* (2023.02); *H10K 2101/40* (2023.02); *H10K 2101/90* (2023.02)

ORGANIC LIGHT-EMITTING DEVICES, DISPLAY PANELS AND DISPLAY APPARATUSES

CROSS-REFERENCE TO RELATED APPLICATIONS

The present disclosure claims a priority to Chinese patent application No. 202011045754.0 filed on Sep. 28, 2020 and entitled "ORGANIC LIGHT-EMITTING DEVICES, DISPLAY PANELS AND DISPLAY APPARATUSES", which is incorporated herein by reference in its entirety.

TECHNICAL FIELD

The present disclosure relates to the field of display technology, and in particular to an organic light-emitting device, a display panel and a display apparatus.

BACKGROUND

Compared with other display devices, display devices based on OLED (Organic Light-Emitting Diode) have advantages of low power consumption and good display brightness due to characteristics of self-luminescence, wide viewing angle, and high luminous efficiency. In recent years, OLED display devices have become popular emerging flat panel display products at home and abroad.

How to design OLED display devices with higher luminous efficiency and longer lifetime has been one of the directions that researchers in the art have been working on.

SUMMARY

According to a first aspect of embodiments of the present disclosure, there is provided an organic light-emitting device including:
- a first electrode layer;
- a first light-emitting layer provided on the first electrode layer and including a first host material and a first guest material;
- a second light-emitting layer provided on the first light-emitting layer and including a second host material and a second guest material; and
- a second electrode layer provided on the second light-emitting layer, where the first guest material has a general structural formula as indicated in Formula I:

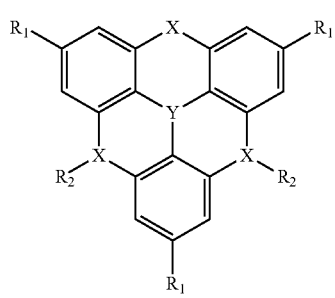

Formula I where X is selected from carbon, nitrogen, oxygen, sulfur, or boron;
Y is selected from nitrogen or boron, and Y is different from X; and $R_1$ and $R_2$ are selected from hydrogen, methyl, isopropyl, tert-butyl, substituted or unsubstituted aryl, substituted or unsubstituted alkyl aryl, or substituted or unsubstituted nitrogen-containing aryl, respectively.

In an embodiment, the first host material has a general structural formula as indicated in Formula II:

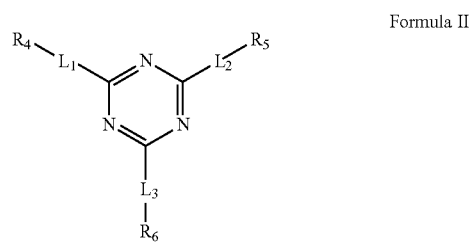

Formula II where $R_4$, $R_5$ and $R_6$ are selected from hydrogen, substituted or unsubstituted phenyl, substituted or unsubstituted diphenylamine, substituted or unsubstituted carbazole, substituted or unsubstituted indolocarbazole, substituted or unsubstituted dibenzothiophene, substituted or unsubstituted dibenzofuran, substituted or unsubstituted benzothienocarbazole, substituted or unsubstituted benzofurocarbazole, substituted or unsubstituted dihydroacridine, or substituted or unsubstituted phenoxazine, respectively, and $R_5$ contains a heteroatom; and $L_1$ and $L_3$ are selected from single bond, or phenyl, respectively, and $L_2$ is phenyl and is connected to the heteroatom of $R_5$.

In an embodiment, a mass concentration of the first guest material in the first light-emitting layer ranges from 0.5% to 5.0%.

In an embodiment, an overlapping area between an absorption spectrum of the second guest material and an electroluminescence spectrum of the first guest material is greater than 70% of an area of the electroluminescence spectrum of the first guest material under normalized conditions.

In an embodiment, the first light-emitting layer further includes a first thermally activated delayed fluorescent material.

In an embodiment, an overlapping area between an absorption spectrum of the first guest material and an electroluminescence spectrum of the first thermally activated delayed fluorescent material is greater than or equal to 50% of an area of the electroluminescence spectrum of the first thermally activated delayed fluorescent material, and is greater than or equal to 70% of an area of the absorption spectrum of the first guest material under normalized conditions.

In an embodiment, the first guest material has a thermally activated delayed fluorescence characteristic; and/or a full width at half maximum, FWHM of a photoluminescence spectrum of the first guest material is less than 30 nm, and a peak wavelength of the photoluminescence spectrum of the first guest material is less than 490 nm, and a peak wavelength of a photoluminescence spectrum of the second guest material is greater than 500 nm.

In an embodiment, the second light-emitting layer further includes a second thermally activated delayed fluorescent material.

In an embodiment, an overlapping area between an absorption spectrum of the second guest material and an electroluminescence spectrum of the second thermally activated delayed fluorescent material is greater than or equal to 50% of an area of the electroluminescence spectrum of the second thermally activated delayed fluorescent material, and is greater than or equal to 70% of an area of the absorption spectrum of the second guest material under normalized conditions.

According to a second aspect of embodiments of the present disclosure, there is provided a display panel including the organic light-emitting device as described above.

According to a third aspect of embodiments of the present disclosure, there is provided a display apparatus including the display panel as described above.

DETAILED DESCRIPTION

Figure 1:
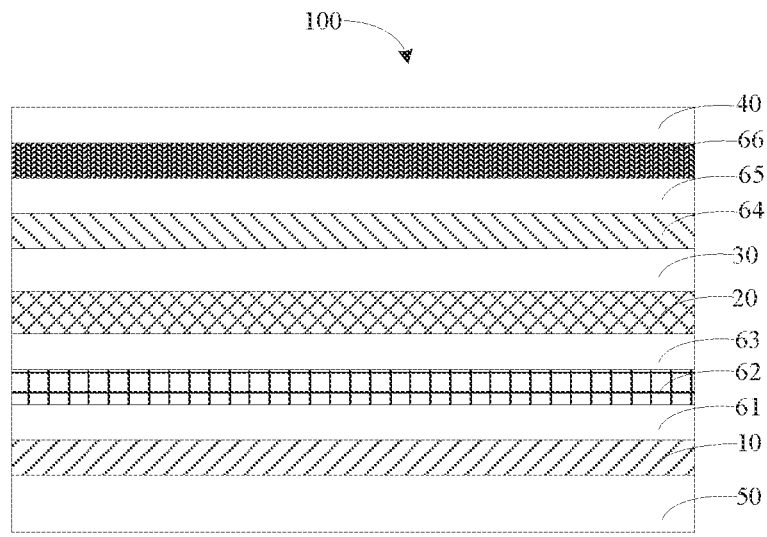
FIG. 1 is a schematic structural diagram illustrating an organic light-emitting device according to an exemplary embodiment of the present disclosure.

Exemplary embodiments will be described in detail herein, and examples thereof are illustrated in the drawings. When the following description refers to the drawings, the same numbers in different drawings indicate the same or similar elements, unless otherwise indicated. Implementations described in the following exemplary embodiments do not represent all implementations in accordance with the present disclosure. Rather, they are merely examples of apparatuses and methods in accordance with some aspects of the present disclosure as detailed in the appended claims.

Terms used in the present disclosure are only for the purpose of describing specific embodiments, and are not intended to limit the present disclosure. Singular forms of "a", "said" and "the" used in the present disclosure and the appended claims are also intended to include plural forms, unless the context clearly indicates otherwise. It should also be understood that the term "and/or" as used herein refers to and includes any or all possible combinations of one or more of the associated listed items.

It should be understood that though terms "first", "second", "third", etc. may be used in the present disclosure to describe various information, such information should not be limited to these terms. These terms are only used to distinguish the same type of information from each other. For example, without departing from the scope of the present disclosure, first information may also be referred to as second information, and similarly, second information may also be referred to as first information. Depending on the context, the word "if" as used herein may be interpreted as "when", "upon" or "in response to determining".

Embodiments of the present disclosure provide an organic light-emitting device, a display panel, and a display apparatus. The organic light-emitting device, the display panel, and the display apparatus according to the embodiments of the present disclosure will be described in detail below in conjunction with the accompanying drawings. Features in the following embodiments may complement each other or be combined with each other, without conflict.

Embodiments of the present disclosure provide an organic light-emitting device. Referring to FIG. 1, the organic light-emitting device 100 according to the embodiments of the present disclosure includes a first electrode layer 10, a first light-emitting layer 20 provided on the first electrode layer 10, a second light-emitting layer 30 provided on the first light-emitting layer 20, and a second electrode layer 40 provided on the second light-emitting layer 30.

The first light-emitting layer 20 includes a first host material and a first guest material. The second light-emitting layer 30 includes a second host material and a second guest material. The first guest material has a general structural formula as indicated in Formula I:

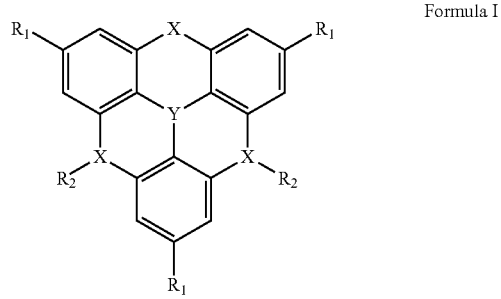

Formula I

X is selected from carbon, nitrogen, oxygen, sulfur, or boron. Y is selected from nitrogen or boron, and Y is different from X. $R_1$ and $R_2$ are selected from hydrogen, methyl, isopropyl, tert-butyl, substituted or unsubstituted aryl, substituted or unsubstituted alkyl aryl, or substituted or unsubstituted nitrogen-containing aryl, respectively.

The organic light-emitting device 100 according to the embodiments of the present disclosure includes the first light-emitting layer 20 and the second light-emitting layer 30. Light emitted by the first light-emitting layer 20 is absorbed by the second light-emitting layer 30, i.e., the first light-emitting layer 20 transfers energy to the second light-emitting layer 30. Compared with the scheme in which the organic light-emitting device includes only a single light-emitting layer, exciton annihilation due to high content of excitons in some positions in the light-emitting layer can be improved, which is conducive to increasing the luminous efficiency and lifetime of the organic light-emitting device 100. The first guest material has a general structural formula as indicated in Formula I, and has an electroluminescence spectrum with a narrower bandwidth, such that an overlapping area between an electroluminescence spectrum of the first guest material and an absorption spectrum of the second guest material may be larger, and thus more light emitted by the first light-emitting layer 20 may be absorbed by the second light-emitting layer 30, which is conducive to increasing the luminous efficiency of the organic light-emitting device, and also enhancing the color purity of light emitted by the organic light-emitting device. Moreover, the first guest material has a thermally activated delayed fluorescence (TADF) characteristic, which is conducive to transfer of energy in the first light-emitting layer 20.

In some embodiments, the organic light-emitting device 100 may further include a substrate 50 on which the first electrode layer 10 is formed. The substrate 50 may be a glass substrate.

In the embodiments of the present disclosure, Y in Formula I is preferably boron, which allows for a narrower bandwidth of the electroluminescence spectrum of the first guest material. $R_1$ may be the same as or different from $R_2$.

In the embodiments of the present disclosure, the first host material does not emit light, and may transfer energy to the first guest material. The first guest material receives the energy from the first host material and transitions from a ground state to an excited state which is unstable, and then the first guest material transitions back to the ground state and emits photons. The second host material does not emit light, and may transfer energy to the second guest material. The second guest material receives the energy from the second host material and the energy emitted by the first guest material, transitions from a ground state to an excited state, and then transitions back to the ground state and emits photons.

In the organic light-emitting device according to the embodiments of the present disclosure, the first guest material has the following characteristics.

$\Delta E_{ST}(C) < 0.2$ eV, FWHM$(C) < 30$ nm, and $\lambda_{peak}(C) < 490$ nm.

$\Delta E_{ST}(C)$ denotes an energy gap between singlet excited state energy and triplet excited state energy of the first guest material. FWHM$(C)$ denotes a full width at half maximum (FWHM) of a photoluminescence spectrum of the first guest material. $\lambda_{peak}(C)$ denotes a peak wavelength of the photoluminescence spectrum of the first guest material. It can be seen that the first guest material has a narrower FWHM, and the first light-emitting layer 20 may emit blue light.

In an embodiment, a mass concentration of the first guest material in the first light-emitting layer 20 may range from 0.5% to 5.0%. In this way, it can avoid annihilation of triplet excitons caused by an excessively high concentration of the triplet excitons in the first light-emitting layer 20 due to an excessive mass concentration of the first guest material in the first light-emitting layer 20, so as to increase the luminous efficiency of the organic light-emitting device. Also, it can be avoided that the mass concentration of the first guest material in the first light-emitting layer 20 is too small to effectively increase the luminous efficiency of the organic light-emitting device. The mass concentration of the first guest material in the first light-emitting layer 20 may be, for example, 0.5%, 1.0%, 1.5%, 2.0%, 2.5%, 3.0%, 3.5%, 4.0%, 4.5%, 5.0%, etc.

In some embodiments, the first guest material may be selected from compound A1, compound A2, compound A3, compound A4, compound A5 or compound A6 as follows.

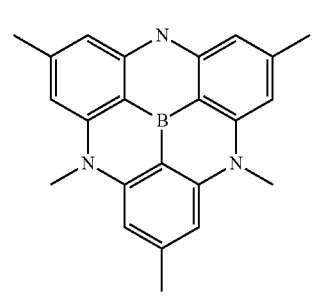

Compound A1

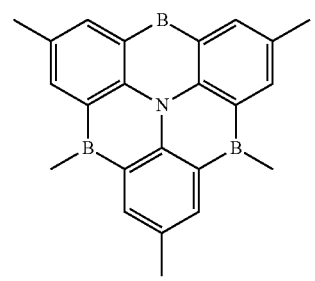

Compound A2

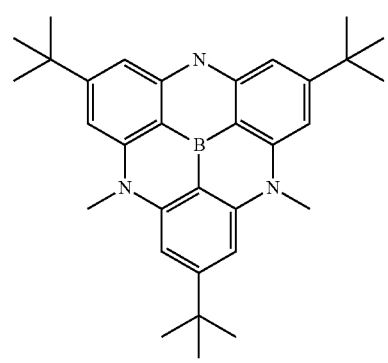

Compound A3

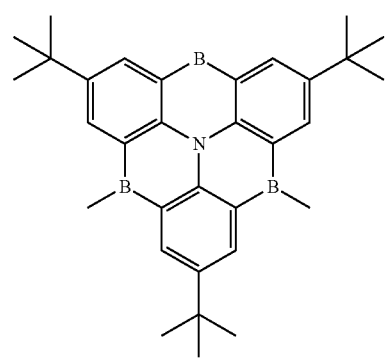

Compound A4

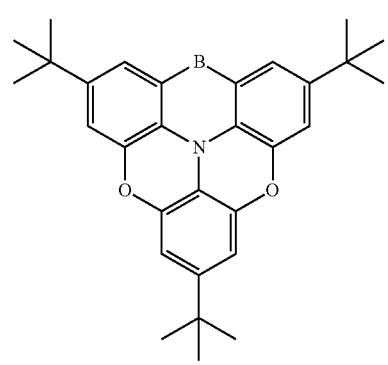

Compound A5

-continued

Compound A6

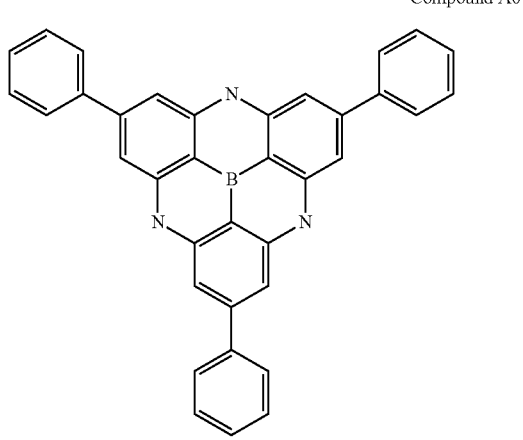

In other embodiments, the first guest material may be selected from other compounds.

In an embodiment, the first host material has a general structural formula as indicated in Formula II:

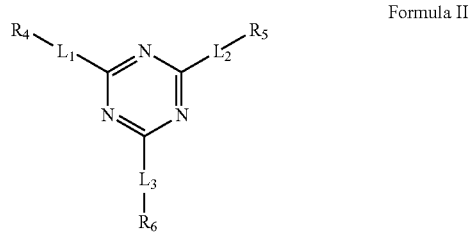

Formula II $R_4$, $R_5$ and $R_6$ are selected from hydrogen, substituted or unsubstituted phenyl, substituted or unsubstituted diphenylamine, substituted or unsubstituted carbazole, substituted or unsubstituted indolocarbazole, substituted or unsubstituted dibenzothiophene, substituted or unsubstituted dibenzofuran, substituted or unsubstituted benzothienocarbazole, substituted or unsubstituted benzofurocarbazole, substituted or unsubstituted dihydroacridine, or substituted or unsubstituted phenoxazine, respectively, and $R_5$ contains a heteroatom. $L_1$ and $L_3$ are selected from single bond, or phenyl, respectively, and $L_2$ is phenyl and is connected to the heteroatom of $R_5$. At least one of $R_4$, $R_5$ and $R_6$ is not hydrogen.

When the general structural formula of the first host material is Formula II, the first host material is a bipolar material which may transport both holes and electrons, and may make transport of carriers in the first light-emitting layer 20 balanced, which is conducive to improving the stability of the organic light-emitting device and prolonging the lifetime of the organic light-emitting device. Moreover, the first host material has a high triplet excited state energy, which helps to confine the excitons in the first guest material, and increase the energy generated during exciton recombination, thereby increasing the luminous efficiency of the organic light-emitting device.

In the organic light-emitting device according to the embodiments of the present disclosure, the first host material has the following characteristic:

$$T_1(A) > 2.6 \text{ eV}.$$

$T_1(A)$ denotes triplet excited state energy of the first host material. The triplet excited state energy of the first host material is greater than 2.6 eV, which is beneficial to confine the excitons in the first guest material.

In some embodiments, a mass concentration of the first host material in the first light-emitting layer may range from 45% to 99.5%.

In some embodiments, the first host material may be selected from compound B1, compound B2, compound B3, compound B4, compound B5 or compound B6 as follows.

Compound B1

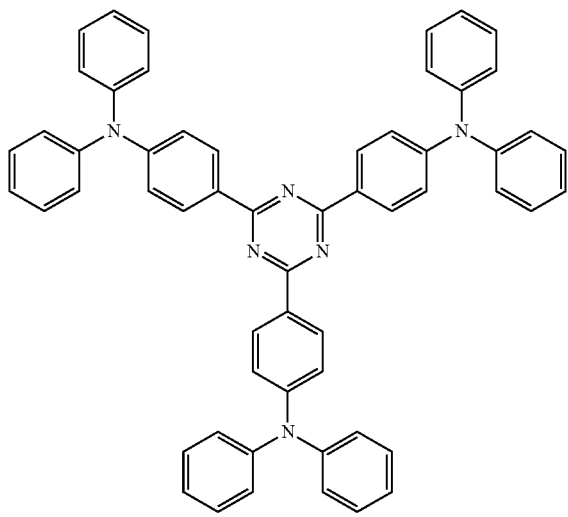

Compound B2

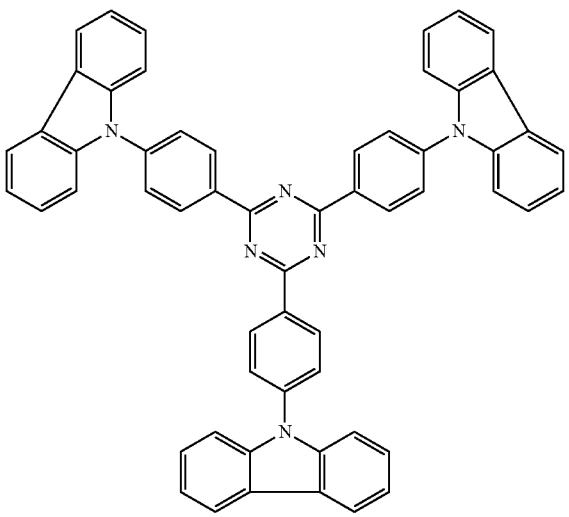

-continued

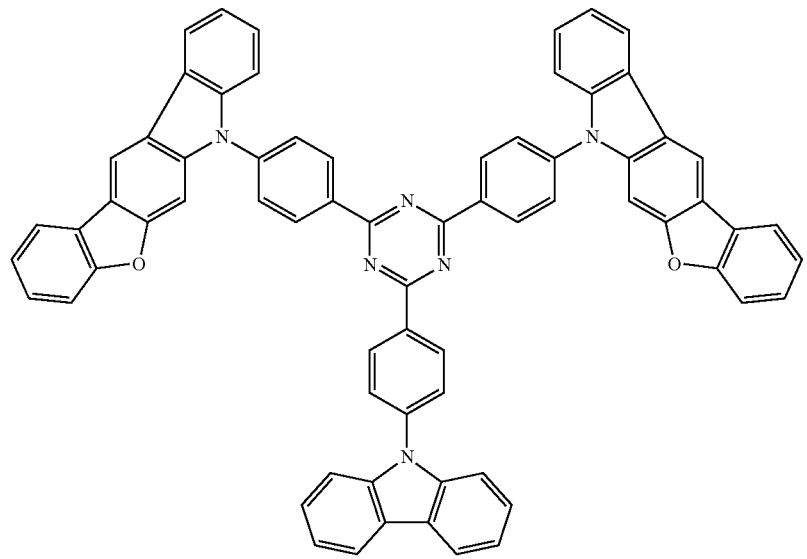
Compound B3

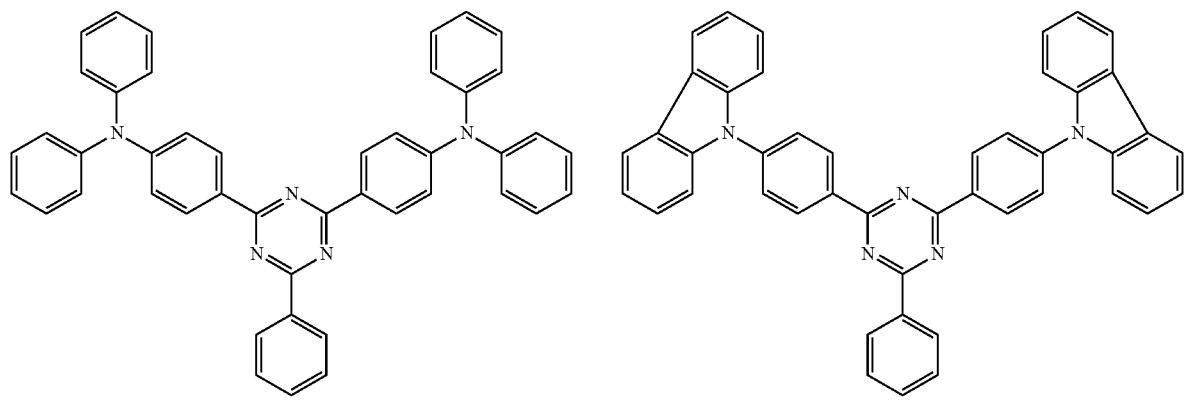
Compound B4
Compound B5

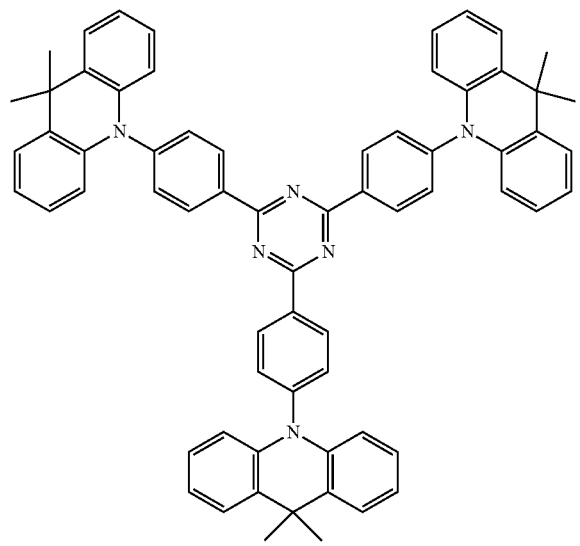
Compound B6

In other embodiments, the first host material may be selected from other compounds.

In an embodiment, the first light-emitting layer 20 may further include a first thermally activated delayed fluorescent material. The first thermally activated delayed fluorescent material does not emit light, and may transfer energy to the first guest material after converting triplet excitons to singlet excitons through reverse intersystem crossing, enabling energy transfer from the first host material to the first guest material to be more adequate. By utilizing the triplet excitons in the organic light-emitting device which do not emit light originally, the luminous efficiency of the organic light-emitting device can be effectively increased. Compared with the scheme in which the luminous efficiency of the organic light-emitting device is increased by adding metal iridium or metal platinum in the light-emitting layer, the organic light-emitting device according to the embodiments of the present disclosure has a lower cost and less environmental pollution.

In some embodiments, an overlapping area between an absorption spectrum of the first guest material and an electroluminescence spectrum of the first thermally activated delayed fluorescent material is greater than or equal to 50% of an area of the electroluminescence spectrum of the first thermally activated delayed fluorescent material, and is greater than or equal to 70% of an area of the absorption spectrum of the first guest material under normalized conditions.

The larger the overlapping area between the absorption spectrum of the first guest material and the electroluminescence spectrum of the first thermally activated delayed fluorescent material, the more adequate the energy transfer between the first thermally activated delayed fluorescent material and the first guest material, the more fully the first guest material can emit light. By setting the overlapping area between the absorption spectrum of the first guest material and the electroluminescence spectrum of the first thermally activated delayed fluorescent material to be greater than or equal to 50% of the area of the electroluminescence spectrum of the first thermally activated delayed fluorescent material, and greater than or equal to 70% of the area of the absorption spectrum of the first guest material under the normalized conditions, the energy transfer between the first thermally activated delayed fluorescent material and the first guest material may be more adequate, and the first guest material can emit light more fully, thereby increasing the luminous efficiency of the organic light-emitting device.

Figure 2:
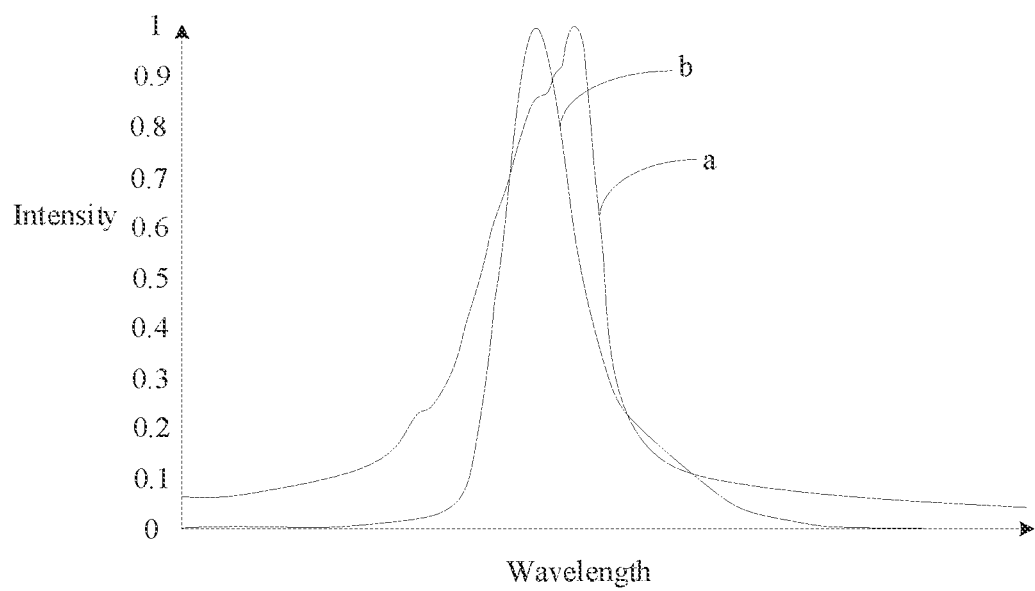
FIG. 2 is a spectrogram illustrating an absorption spectrum of a first guest material and an electroluminescence spectrum of a first thermally activated delayed fluorescent material under normalized conditions according to an exemplary embodiment of the present disclosure.

FIG. 2 is a spectrogram illustrating the absorption spectrum of the first guest material and the electroluminescence spectrum of the first thermally activated delayed fluorescent material under the normalized conditions. Curve a shows the absorption spectrum of the first guest material, and curve b shows the electroluminescence spectrum of the first thermally activated delayed fluorescence material. As can be seen from FIG. 2, the absorption spectrum of the first guest material has a larger overlapping area with the electroluminescence spectrum of the first thermally activated delayed fluorescent material under the normalized conditions.

In some embodiments, the electroluminescence spectra of the first thermally activated delayed fluorescent material and the first guest material satisfy the following relationship: $\lambda(B)<\lambda(C)$, where $\lambda(B)$ denotes a wavelength of an emission peak with the highest intensity in the electroluminescence spectrum of the first thermally activated delayed fluorescent material, and $\lambda(C)$ denotes a wavelength of an emission peak with the highest intensity in the electroluminescence spectrum of the first guest material.

In some embodiments, the first thermally activated delayed fluorescent material has the following characteristic: $\Delta E_{ST}(B)<0.2$ eV, where $\Delta E_{ST}(B)$ denotes an energy gap between singlet excited state energy and triplet excited state energy of the first thermally activated delayed fluorescent material. A mass concentration of the first thermally activated delayed fluorescent material in the first light-emitting layer may range from 5% to 50%.

In some embodiments, the first host material, the first thermally activated delayed fluorescent material and the first guest material in the first light-emitting layer satisfy the following relationships:

$$S_1(A)>S_1(B)>S_1(C); \text{ and}$$

$$T_1(A)>T_1(B)>T_1(C).$$

$S_1(A)$ denotes singlet excited state energy of the first host material, $S_1(B)$ denotes singlet excited state energy of the first thermally activated delayed fluorescent material, and $S_1(C)$ denotes singlet excited state energy of the first guest material. $T_1(A)$ denotes triplet excited state energy of the first host material, $T_1(B)$ denotes triplet excited state energy of the first thermally activated delayed fluorescent material, and $T_1(C)$ denotes triplet excited state energy of the first guest material.

In this way, energy may be smoothly transferred from the first host material to the first guest material.

In an embodiment, the second light-emitting layer 30 may further include a second thermally activated delayed fluorescent material. The second thermally activated delayed fluorescent material does not emit light, and may transfer energy to the second guest material after converting triplet excitons to singlet excitons through reverse intersystem crossing, enabling energy transfer from the second host material to the second guest material to be more adequate, which is conducive to increasing the luminous efficiency and lifetime of the organic light-emitting device.

In an embodiment, a hole mobility of the second host material is greater than an electron mobility of the second host material. The second host material has the following characteristic: $\Delta E_{ST}(D)>0.2$ eV, where $\Delta E_{ST}(D)$ denotes an energy gap between singlet excited state energy and triplet excited state energy of the second host material.

In some embodiments, a mass concentration of the second host material in the second light-emitting layer may range from 45% to 90%.

In an embodiment, the second thermally activated delayed fluorescent material has the following characteristic: $\Delta E_{ST}(E)<0.2$ eV, where $\Delta E_{ST}(E)$ denotes an energy gap between singlet excited state energy and triplet excited state energy of the second thermally activated delayed fluorescent material.

In some embodiments, a mass concentration of the second thermally activated delayed fluorescent material in the second light-emitting layer may range from 5% to 50%.

In an embodiment, the second guest material has the following characteristic: $\lambda_{peak}(F)>500$ nm, where $\lambda_{peak}(F)$ denotes a peak wavelength of a photoluminescence spectrum of the second guest material. The second light-emitting layer 30 emits light with the peak wavelength greater than 500 nm, and the second light-emitting layer 30 may emit red or green light.

In some embodiments, a mass concentration of the second guest material in the second light-emitting layer 30 may range from 0.5% to 5.0%.

In some embodiments, the second host material, the second thermally activated delayed fluorescent material and the second guest material in the second light-emitting layer satisfy the following relationships:

$$S_1(D)>S_1(E); \text{ and}$$

$$T_1(D)>T_1(E)>T_1(F).$$

$S_1(D)$ denotes singlet excited state energy of the second host material, and $S_1(E)$ denotes singlet excited state energy of the second thermally activated delayed fluorescent material. $T_1(D)$ denotes triplet excited state energy of the second host material, $T_1(E)$ denotes triplet excited state energy of the second thermally activated delayed fluorescent material, and $T_1(F)$ denotes triplet excited state energy of the second guest material.

In this way, energy may be smoothly transferred from the second host material to the second guest material.

In an embodiment, an overlapping area between an absorption spectrum of the second guest material and an electroluminescence spectrum of the second thermally activated delayed fluorescent material is greater than or equal to 50% of an area of the electroluminescence spectrum of the second thermally activated delayed fluorescent material, and is greater than or equal to 70% of an area of the absorption spectrum of the second guest material under normalized conditions.

The larger the overlapping area between the absorption spectrum of the second guest material and the electroluminescence spectrum of the second thermally activated delayed fluorescent material, the more adequate the energy transfer between the second thermally activated delayed fluorescent material and the second guest material, the more fully the second guest material can emit light. By setting the overlapping area between the absorption spectrum of the second guest material and the electroluminescence spectrum of the second thermally activated delayed fluorescent material to be greater than or equal to 50% of the area of the electroluminescence spectrum of the second thermally activated delayed fluorescent material, and greater than or equal to 70% of the area of the absorption spectrum of the second guest material under the normalized conditions, the energy transfer between the second thermally activated delayed fluorescent material and the second guest material may be more adequate, and the second guest material can emit light more fully, thereby increasing the luminous efficiency of the organic light-emitting device.

Figure 3:
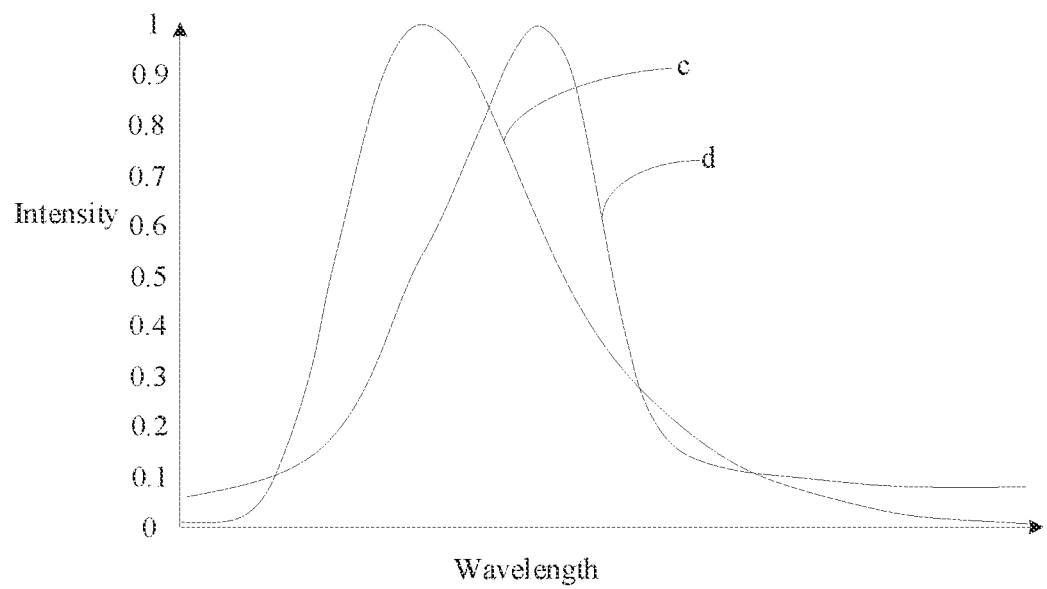
FIG. 3 is a spectrogram illustrating an absorption spectrum of a second guest material and an electroluminescence spectrum of a second thermally activated delayed fluorescent material under normalized conditions according to an exemplary embodiment of the present disclosure.

FIG. 3 is a spectrogram illustrating the absorption spectrum of the second guest material and the electroluminescence spectrum of the second thermally activated delayed fluorescent material under the normalized conditions. Curve c shows the electroluminescence spectrum of the second thermally activated delayed fluorescence material, and curve d shows the absorption spectrum of the second guest material. As can be seen from FIG. 3, the absorption spectrum of the second guest material has a larger overlapping area with the electroluminescence spectrum of the second thermally activated delayed fluorescent material under the normalized conditions.

In some embodiments, the electroluminescence spectra of the second host material, the second thermally activated delayed fluorescent material and the second guest material satisfy the following relationship: $\lambda(D) > \lambda(E) > \lambda(F)$, where $\lambda(D)$ denotes a wavelength of an emission peak with the highest intensity in the electroluminescence spectrum of the second host material, $\lambda(E)$ denotes a wavelength of an emission peak with the highest intensity in the electroluminescence spectrum of the second thermally activated delayed fluorescent material, and $\lambda(F)$ denotes a wavelength of an emission peak with the highest intensity in the electroluminescence spectrum of the second guest material.

In an embodiment, an overlapping area between an absorption spectrum of the second guest material and an electroluminescence spectrum of the first guest material is greater than 70% of an area of the electroluminescence spectrum of the first guest material under normalized conditions.

The larger the overlapping area between the absorption spectrum of the second guest material and the electroluminescence spectrum of the first guest material, the more adequate the energy transfer between the second guest material and the first guest material, the more fully the second guest material can emit light. By setting the overlapping area between the absorption spectrum of the second guest material and the electroluminescence spectrum of the first guest material to be greater than 70% of the area of the electroluminescence spectrum of the first guest material under the normalized conditions, the second guest material can emit light more fully, thereby increasing the luminous efficiency of the organic light-emitting device. In some embodiments, the overlapping area between the absorption spectrum of the second guest material and the electroluminescence spectrum of the first guest material may reach 90% or 100% of the area of the electroluminescence spectrum of the first guest material.

Figure 4:
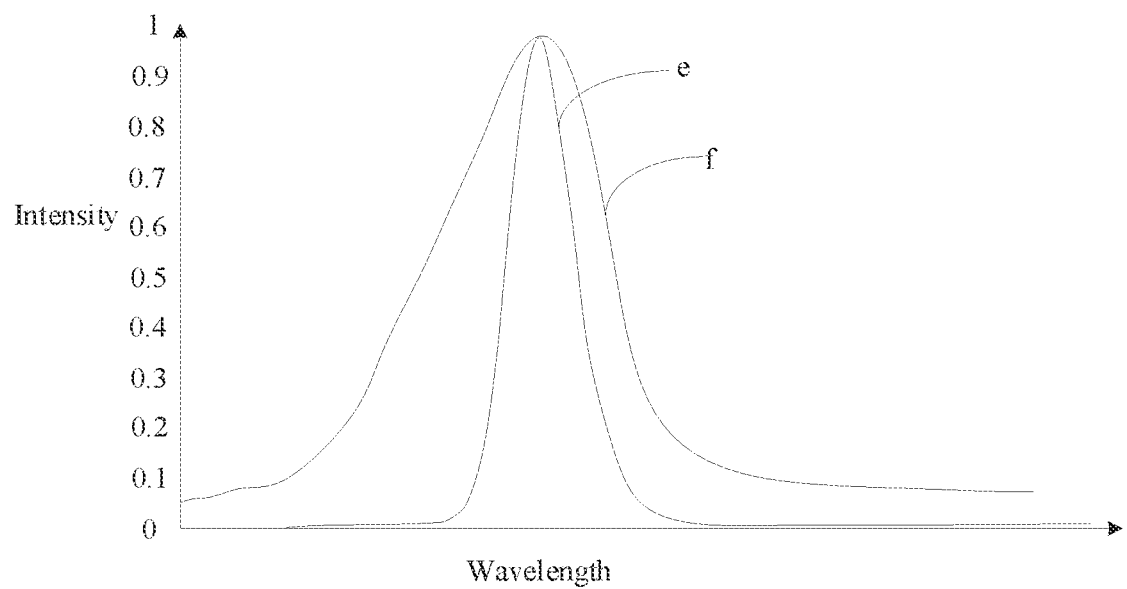
FIG. 4 is a spectrogram illustrating an absorption spectrum of a second guest material and an electroluminescence spectrum of a first guest material under normalized conditions according to an exemplary embodiment of the present disclosure.

FIG. 4 is a spectrogram illustrating the absorption spectrum of the second guest material and the electroluminescence spectrum of the first guest material under the normalized conditions. Curve e shows the electroluminescence spectrum of the first guest material, and curve f shows the absorption spectrum of the second guest material. As can be seen from FIG. 4, the overlapping area between the absorption spectrum of the second guest material and the electroluminescence spectrum of the first guest material is 100% of the area of the electroluminescence spectrum of the first guest material under the normalized conditions.

In the embodiments of the present disclosure, the first host material may be the same as or different from the second host material. The first thermally activated delayed fluorescent material may be the same as or different from the second thermally activated delayed fluorescent material. The first guest material may be different from the second guest material.

In some embodiments, a thickness of the first light-emitting layer is less than 50% of a total thickness of the first light-emitting layer and the second light-emitting layer. The thickness of the first light-emitting layer 20 may be, for example, 10 nm, and the thickness of the second light-emitting layer 30 may be, for example, 20 nm.

In some embodiments, the first electrode layer is an anode and the second electrode layer is a cathode. Referring back to FIG. 1, the organic light-emitting device may further include a hole injection layer 61, a hole transport layer 62 and an electron blocking layer 63 provided between the first electrode layer 10 and the first light-emitting layer 20, and a hole blocking layer 64, an electron transport layer 65 and an electron injection layer 66 provided between the second light-emitting layer 30 and the second electrode layer 40. The hole injection layer 61, the hole transport layer 62 and the electron blocking layer 63 are sequentially stacked on the first electrode layer 10, and the hole blocking layer 64, the electron transport layer 65 and the electron injection layer 66 are sequentially stacked on the second light-emitting layer 30. The organic light-emitting device may further include a capping layer provided on the second electrode layer 40.

In order to verify the performance of the organic light-emitting device according to the embodiments of the present disclosure, the organic light-emitting device according to the embodiments of the present disclosure (hereinafter referred to as the first organic light-emitting device), and an organic light-emitting device including only one light-emitting layer according to a Comparative Example (hereinafter referred to as the second organic light-emitting device) were prepared respectively, and the performance of the two organic light-emitting devices was tested.

The first organic light-emitting device was prepared as follows.

Firstly, a first electrode layer was formed on a glass substrate. The first electrode layer may include a metallic silver film layer and an indium tin oxide film layer. The first electrode layer may be formed by vacuum vapor deposition at a vacuum degree of $1 \times 10^5$ Pa. A thickness of the metallic silver film layer may be 90 nm and a thickness of the indium tin oxide film layer may be 10 nm.

Then, a hole injection layer was vapor-deposited on the first electrode layer.

Then, a hole transport layer was vapor-deposited on the hole injection layer.

Next, a compound B1, a first thermally activated delayed fluorescent material and a compound A1 were vapor-deposited on the hole transport layer using a co-evaporation process to form a first light-emitting layer with a thickness of 10 nm. A mass concentration of the compound B1 was 79%, a mass concentration of the first thermally activated delayed fluorescent material was 20%, and a mass concentration of the compound A1 was 1% in the first light-emitting layer.

Next, a second host material, a second thermally activated delayed fluorescent material and a second guest material were vapor-deposited on the first light-emitting layer using a co-evaporation process to form a second light-emitting layer with a thickness of 20 nm. A mass concentration of the second host material was 79%, a mass concentration of the second thermally activated delayed fluorescent material was 20%, and a mass concentration of the second guest material was 1% in the second light-emitting layer.

Then, an electron transport layer was vapor-deposited on the second light-emitting layer.

Then, an electron injection layer was vapor-deposited on the electron transport layer, and a thickness of the electron injection layer was 1 nm.

Next, a second electrode layer was vapor-deposited on the electron injection layer. The second electrode layer may include magnesium and aluminium with a mass ratio of 9:1, and a thickness of the second electrode layer may be 15 nm.

Next, a capping layer was vapor-deposited on the second electrode layer, and a thickness of the capping layer may be 60 nm.

The second organic light-emitting device was prepared as follows.

Firstly, a first electrode layer was formed on a glass substrate. The first electrode layer may include a metallic silver film layer and an indium tin oxide film layer. The first electrode layer may be formed by vacuum vapor deposition at a vacuum degree of $1 \times 10^1$ Pa. A thickness of the metallic silver film layer may be 90 nm and a thickness of the indium tin oxide film layer may be 10 nm.

Then, a hole injection layer was vapor-deposited on the first electrode layer.

Then, a hole transport layer was vapor-deposited on the hole injection layer.

Next, a second host material, a second thermally activated delayed fluorescent material and a second guest material were vapor-deposited on the hole transport layer using a co-evaporation process to form a third light-emitting layer with a thickness of 30 nm. A mass concentration of the second host material was 79%, a mass concentration of the second thermally activated delayed fluorescent material was 20%, and a mass concentration of the second guest material was 1% in the third light-emitting layer.

Then, an electron transport layer was vapor-deposited on the third light-emitting layer.

Then, an electron injection layer was vapor-deposited on the electron transport layer, and a thickness of the electron injection layer was 1 nm.

Next, a second electrode layer was vapor-deposited on the electron injection layer. The second electrode layer may include magnesium and aluminium with a mass ratio of 9:1, and a thickness of the second electrode layer may be 15 nm.

Next, a capping layer was vapor-deposited on the second electrode layer, and a thickness of the capping layer may be 60 nm.

Singlet excited state energy and triplet excited state energy of the compound A1, the first thermally activated delayed fluorescent material, the compound B1, the second host material, the second thermally activated delayed fluorescent material, and the second guest material are shown in Table 1.

TABLE 1

|  | T1 (eV) | S1 (eV) |
|---|---|---|
| Compound B1 | 2.73 | 2.97 |
| The second host material | 2.70 | 2.91 |
| The first thermally activated delayed fluorescent material | 2.70 | 2.76 |
| The second thermally activated delayed fluorescent material | 2.68 | 2.72 |
| Compound A1 | 2.63 | 2.68 |
| The second guest material | 2.38 | 2.75 |

Performance parameters of the first organic light-emitting device according to the embodiments of the present disclosure and the second organic light-emitting device according to the Comparative Example are shown in Table 2.

TABLE 2

| Device | Current density (mA/cm$^2$) | Voltage (V) | Efficiency (cd/A) | Chromaticity coordinate (CIE-1931) | LT90 lifetime |
|---|---|---|---|---|---|
| The first organic light-emitting device | 10 | 95.6% | 121% | (0.34, 0.54) | 137% |
| The second organic light-emitting device | 10 | 100% | 100% | (0.34, 0.55) | 100% |

LT90 lifetime refers to length of time it takes for the brightness of an organic light-emitting device to decay to 90% of its maximum brightness. Values of voltage, efficiency and LT90 lifetime in Table 2 are all percentage values given based on the Comparative Example.

As can be seen from Table 2, in the case that there is little or no difference in the current density and the chromaticity coordinate between the organic light-emitting device according to the embodiments of the present disclosure and the organic light-emitting device according to the Comparative Example, the organic light-emitting device according to the embodiments of the present disclosure may have lower energy consumption, higher luminous efficiency and longer lifetime.

Figure 5:
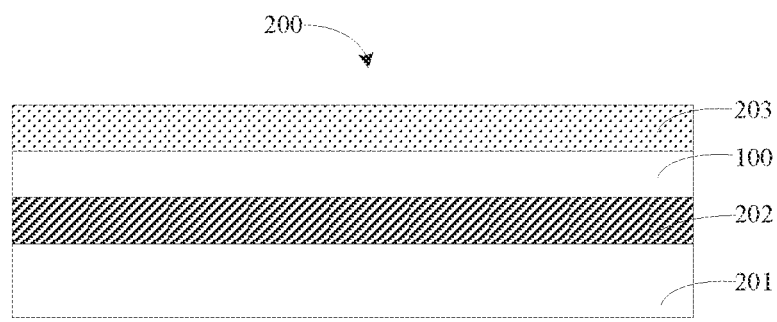
FIG. 5 is a schematic structural diagram illustrating a display panel according to an exemplary embodiment of the present disclosure.

Embodiments of the present disclosure further provide a display panel. Referring to FIG. 5, the display panel 200 includes the organic light-emitting device 100 as described in any of the above embodiments.

The display panel 200 may further include a substrate 201, a drive circuit layer 202, and an encapsulation layer 203, with the drive circuit layer 202 provided on the substrate 201, the organic light-emitting device 100 provided on the drive circuit layer 202, and the encapsulation layer 203 provided on the organic light-emitting device 100. The substrate 201 may be a flexible substrate or a rigid substrate.

Embodiments of the present disclosure further provide a display apparatus including the display panel 200 as described in the above embodiments.

The display apparatus may further include a housing, in which the display panel is embedded.

The display apparatus according to the embodiments of the present disclosure may include, for example, mobile phone, tablet computer, television, notebook computer, vehicle-mounted device, and any other device with a display function.

In an organic light-emitting device, a display panel and a display apparatus according to embodiments of the present disclosure, the organic light-emitting device includes a first light-emitting layer and a second light-emitting layer. Light emitted by the first light-emitting layer is absorbed by the second light-emitting layer, i.e., the first light-emitting layer transfers energy to the second light-emitting layer. Compared with the scheme in which the organic light-emitting device includes only a single light-emitting layer, exciton annihilation due to high content of excitons in some positions in the light-emitting layer can be improved, which is conducive to increasing the luminous efficiency and lifetime of the organic light-emitting device. A first guest material has a general structural formula as indicated in Formula I, and has an electroluminescence spectrum with a narrower bandwidth, such that an overlapping area between an electroluminescence spectrum of the first guest material and an absorption spectrum of a second guest material may be larger, and thus more light emitted by the first light-emitting layer may be absorbed by the second light-emitting layer, which is conducive to increasing the luminous efficiency of the organic light-emitting device, and also enhancing the color purity of light emitted by the organic light-emitting device. Moreover, the first guest material has a thermally activated delayed fluorescence (TADF) characteristic, which is conducive to transfer of energy in the first light-emitting layer.

It should be pointed out that in the drawings, sizes of layers and areas may be exaggerated for clarity of illustration. It should be understood that w % ben an element or layer is referred to as being "on" another element or layer, it can be directly on the other element or layer, or an intervening element or layer may be present. In addition, it should be understood that when an element or layer is referred to as being "under" another element or layer, it can be directly under the other element or layer, or there may be more than one intervening layer or element. It should also be understood that when a layer or element is referred to as being "between" two layers or two elements, it can be the only layer between the two layers or the two elements, or there may be more than one intervening layer or element. Similar reference numerals indicate similar elements throughout.

Those skilled in the art will easily conceive of other embodiments of the present disclosure after considering the specification and practicing the disclosure disclosed herein. The present disclosure is intended to cover any variations, uses or adaptive changes of the present disclosure. These variations, uses or adaptive changes follow the general principles of the present disclosure and include common knowledge or conventional technical means in the art that are not disclosed by the present disclosure. The specification and the embodiments are to be regarded as exemplary only, and the true scope and spirit of the present disclosure are pointed out by the following claims.

It should be understood that the present disclosure is not limited to the precise structure that has been described above and shown in the drawings, and various modifications and changes may be made without departing from the scope thereof. The scope of the present disclosure is only limited by the appended claims.

The invention claimed is:

1. An organic light-emitting device, comprising:
a first electrode layer;
a first light-emitting layer provided on the first electrode layer and comprising a first host material and a first guest material;
a second light-emitting layer provided on the first light-emitting layer and comprising a second host material and a second guest material; and
a second electrode layer provided on the second light-emitting layer,
wherein the first guest material has a general structural formula as indicated in Formula I:

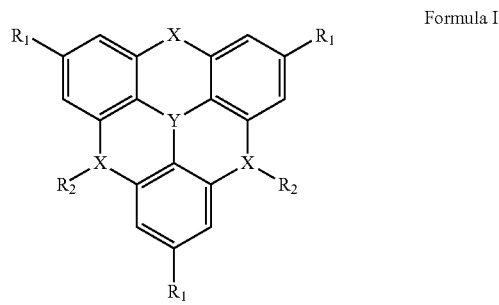

Formula I wherein X is selected from carbon, nitrogen, oxygen, sulfur, or boron;
Y is selected from nitrogen or boron, and Y is different from X; and
$R_1$ and $R_2$ are selected from hydrogen, methyl, isopropyl, tert-butyl, substituted or unsubstituted aryl, substituted or unsubstituted alkyl aryl, or substituted or unsubstituted nitrogen-containing aryl.

2. The organic light-emitting device according to claim 1, wherein the first host material has a general structural formula as indicated in Formula II:

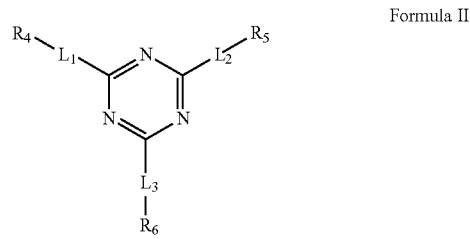

Formula II wherein $R_4$, $R_5$ and $R_6$ are selected from hydrogen, substituted or unsubstituted phenyl, substituted or unsubstituted diphenylamine, substituted or unsubstituted carbazole, substituted or unsubstituted indolocarbazole, substituted or unsubstituted dibenzothiophene, substituted or unsubstituted dibenzofuran, substituted or unsubstituted benzothienocarbazole, substituted or unsubstituted benzofurocarbazole, substituted or unsubstituted dihydroacridine, or substituted or unsubstituted phenoxazine, respectively, and $R_5$ contains a heteroatom; and $L_1$ and $L_3$ are selected from single bond, or phenyl, respectively, and $L_2$ is phenyl and is connected to the heteroatom of $R_5$.

3. The organic light-emitting device according to claim 1, wherein a mass concentration of the first guest material in the first light-emitting layer ranges from 0.5% to 5.0%.

4. The organic light-emitting device according to claim 1, wherein an overlapping area between an absorption spectrum of the second guest material and an electroluminescence spectrum of the first guest material is greater than 70% of an area of the electroluminescence spectrum of the first guest material under normalized conditions.

5. The organic light-emitting device according to claim 1, wherein the first guest material has a thermally activated delayed fluorescence, TADF characteristic; and/or
a full width at half maximum, FWHM of a photoluminescence spectrum of the first guest material is less than 30 nm, and a peak wavelength of the photoluminescence spectrum of the first guest material is less than 490 nm, and a peak wavelength of a photoluminescence spectrum of the second guest material is greater than 500 nm.

6. The organic light-emitting device according to claim 1, wherein the first light-emitting layer further comprises a first thermally activated delayed fluorescent material.

7. The organic light-emitting device according to claim 6, wherein an overlapping area between an absorption spectrum of the first guest material and an electroluminescence spectrum of the first thermally activated delayed fluorescent material is greater than or equal to 50% of an area of the electroluminescence spectrum of the first thermally activated delayed fluorescent material, and is greater than or equal to 70% of an area of the absorption spectrum of the first guest material under normalized conditions.

8. The organic light-emitting device according to claim 1, wherein the second light-emitting layer further comprises a second thermally activated delayed fluorescent material.

9. The organic light-emitting device according to claim 8, wherein an overlapping area between an absorption spectrum of the second guest material and an electroluminescence spectrum of the second thermally activated delayed fluorescent material is greater than or equal to 50% of an area of the electroluminescence spectrum of the second thermally activated delayed fluorescent material, and is greater than or equal to 70% of an area of the absorption spectrum of the second guest material under normalized conditions.

10. A display panel comprising an organic light-emitting device, the organic light-emitting device comprising:
a first electrode layer;
a first light-emitting layer provided on the first electrode layer and comprising a first host material and a first guest material;
a second light-emitting layer provided on the first light-emitting layer and comprising a second host material and a second guest material; and
a second electrode layer provided on the second light-emitting layer,
wherein the first guest material has a general structural formula as indicated in Formula I:

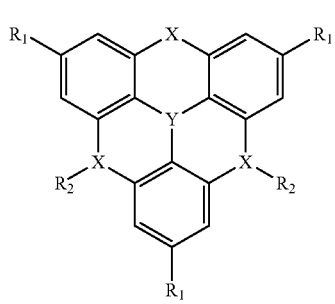

Formula I wherein X is selected from carbon, nitrogen, oxygen, sulfur, or boron;
Y is selected from nitrogen or boron, and Y is different from X; and
$R_1$ and $R_2$ are selected from hydrogen, methyl, isopropyl, tert-butyl, substituted or unsubstituted aryl, substituted or unsubstituted alkyl aryl, or substituted or unsubstituted nitrogen-containing aryl.

11. The display panel according to claim 10, wherein the first host material has a general structural formula as indicated in Formula II:

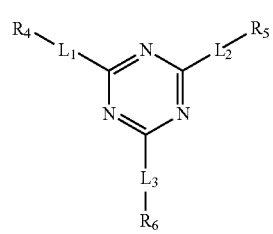

Formula II wherein $R_4$, $R_5$ and $R_6$ are selected from hydrogen, substituted or unsubstituted phenyl, substituted or unsubstituted diphenylamine, substituted or unsubstituted carbazole, substituted or unsubstituted indolocarbazole, substituted or unsubstituted dibenzothiophene, substituted or unsubstituted dibenzofuran, substituted or unsubstituted benzothienocarbazole, substituted or unsubstituted benzofurocarbazole, substituted or unsubstituted dihydroacridine, or substituted or unsubstituted phenoxazine, respectively, and $R_5$ contains a heteroatom; and $L_1$ and $L_3$ are selected from single bond, or phenyl, respectively, and $L_2$ is phenyl and is connected to the heteroatom of $R_5$.

12. The display panel according to claim 10, wherein a mass concentration of the first guest material in the first light-emitting layer ranges from 0.5% to 5.0%.

13. The display panel according to claim 10, wherein an overlapping area between an absorption spectrum of the second guest material and an electroluminescence spectrum of the first guest material is greater than 70% of an area of the electroluminescence spectrum of the first guest material under normalized conditions.

14. The display panel according to claim 10, wherein the first guest material has a thermally activated delayed fluorescence, TADF characteristic; and/or
a full width at half maximum, FWHM of a photoluminescence spectrum of the first guest material is less than 30 nm, and a peak wavelength of the photoluminescence spectrum of the first guest material is less than 490 nm, and a peak wavelength of a photoluminescence spectrum of the second guest material is greater than 500 nm.

15. The display panel according to claim 10, wherein the first light-emitting layer further comprises a first thermally activated delayed fluorescent material.

16. The display panel according to claim 15, wherein an overlapping area between an absorption spectrum of the first guest material and an electroluminescence spectrum of the first thermally activated delayed fluorescent material is greater than or equal to 50% of an area of the electroluminescence spectrum of the first thermally activated delayed fluorescent material, and is greater than or equal to 70% of an area of the absorption spectrum of the first guest material under normalized conditions.

17. The display panel according to claim 10, wherein the second light-emitting layer further comprises a second thermally activated delayed fluorescent material.

18. The display panel according to claim 17, wherein an overlapping area between an absorption spectrum of the second guest material and an electroluminescence spectrum of the second thermally activated delayed fluorescent material is greater than or equal to 50% of an area of the electroluminescence spectrum of the second thermally activated delayed fluorescent material, and is greater than or equal to 70% of an area of the absorption spectrum of the second guest material under normalized conditions.

19. A display apparatus, comprising the display panel according to claim 10.

* * * * *